US012738489B2

(12) United States Patent
Liu et al.

(10) Patent No.: US 12,738,489 B2
(45) Date of Patent: Sep. 15, 2026

(54) MULTI-STAGE LITHIATION FOR CATHODE MATERIAL

(71) Applicant: Ascend Elements, Inc., Westborough, MA (US)

(72) Inventors: Yadong Liu, Westborough, MA (US); Eric Gratz, Westborough, MA (US); Haixia Deng, Westborough, MA (US); Dhiren Mistry, Westborough, MA (US); Anil Parmar, Westborough, MA (US); Martha Monzon, Westborough, MA (US)

(73) Assignee: Bluegrass Infrastructure Partners Holdings, LLC, Toronto (CA)

( * ) Notice: Subject to any disclaimer, the term of this patent is extended or adjusted under 35 U.S.C. 154(b) by 299 days.

(21) Appl. No.: 18/230,938

(22) Filed: Aug. 7, 2023

(65) Prior Publication Data

US 2025/0054964 A1 Feb. 13, 2025

(51) Int. Cl.

| | |
|---|---|
| ***H01B 3/56*** | (2006.01) |
| ***C30B 29/22*** | (2006.01) |
| ***H01M 4/02*** | (2006.01) |
| ***H01M 4/505*** | (2010.01) |
| ***H01M 4/525*** | (2010.01) |
| ***H01M 10/54*** | (2006.01) |

(52) U.S. Cl.
CPC ............. *H01M 4/525* (2013.01); *C30B 29/22* (2013.01); *H01M 4/505* (2013.01); *H01M 10/54* (2013.01); *H01M 2004/021* (2013.01); *H01M 2004/028* (2013.01)

(58) Field of Classification Search
CPC ........ C01G 53/50; H01M 4/505; H01M 4/36; H01M 4/525; H01M 10/54; H01M 2004/028; C22B 23/0407
USPC ...................................................... 252/182.1
See application file for complete search history.

(56) References Cited

U.S. PATENT DOCUMENTS

| | | | |
|---|---|---|---|
| 10,833,321 | B2 | 11/2020 | Wu et al. |
| 11,367,872 | B2 | 6/2022 | Park et al. |
| 2014/0377597 | A1 | 12/2014 | Sloop |

(Continued)

FOREIGN PATENT DOCUMENTS

| | | | |
|---|---|---|---|
| EP | 4202089 | A1 | 6/2023 |
| KR | 1020190009771 | A | 1/2019 |
| WO | 2023034556 | A1 | 3/2023 |

OTHER PUBLICATIONS

International Search Report, PCT/US2023/029617, Apr. 25, 2024, pp. 1-4.

*Primary Examiner* — Tri V Nguyen
(74) *Attorney, Agent, or Firm* — Armis IP Law, LLC

(57) ABSTRACT

A Li-ion cathode material is prepared by a multi-stage lithiation process that separates a total amount of lithium called for by the recycled battery to be used in a series of sintering stages. A leaching, ratio adjustment and coprecipitation sequence forms a cathode precursor having a predetermined ratio of metallic elements from a comingled recycling stream of Li-ion batteries. The precursor is sintered with a lithium salt in a sequence of stages, each having a portion of the total lithium quantity, for a predetermined duration and temperature. The initial sintering stage tends to define the crystallinity of the resulting active cathode material and has a particle size determined at least in part by the portion of lithium at each stage.

14 Claims, 4 Drawing Sheets

(56) References Cited

U.S. PATENT DOCUMENTS

| | | | | |
|---|---|---|---|---|
| 2018/0114983 | A9 | 4/2018 | Dai et al. | |
| 2020/0006762 | A1* | 1/2020 | Park | H01M 4/505 |
| 2021/0013507 | A1 | 1/2021 | Zou et al. | |
| 2021/0143423 | A1 | 5/2021 | Paulsen et al. | |
| 2021/0391606 | A1* | 12/2021 | Wang | C01G 49/02 |
| 2023/0044374 | A1 | 2/2023 | Wang et al. | |
| 2023/0335705 | A1* | 10/2023 | Liu | H01M 4/505 |

* cited by examiner

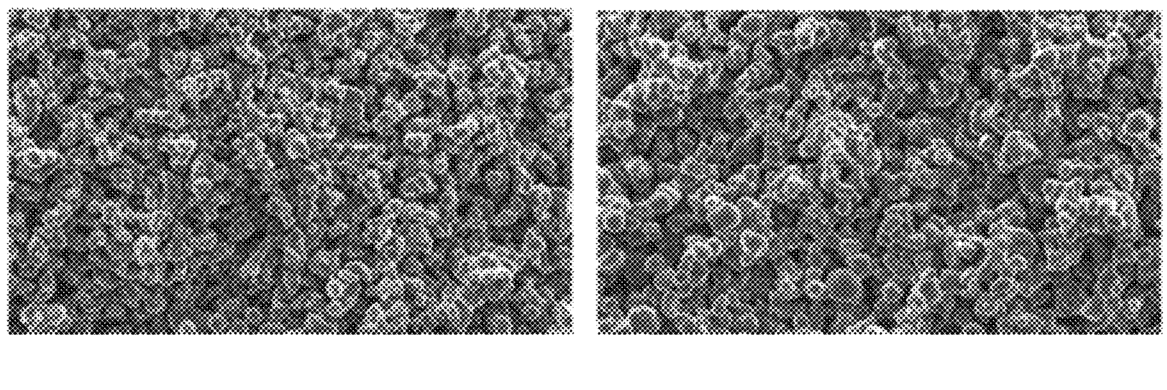
Fig. 3A Fig. 3C
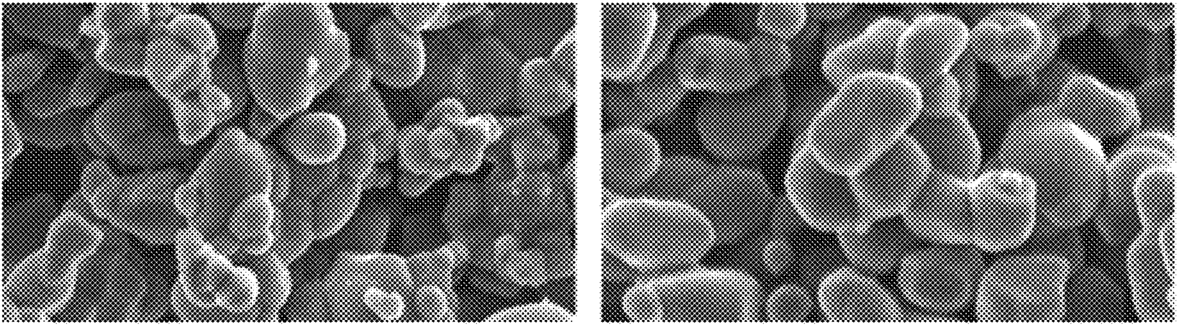
Fig. 3B Fig. 3D

MULTI-STAGE LITHIATION FOR CATHODE MATERIAL

BACKGROUND

Lithium-ion (Li-ion) batteries are a preferred chemistry for secondary (rechargeable) batteries in high discharge applications such as electrical vehicles (EVs) and power tools where electric motors are called upon for rapid acceleration. Li-ion batteries include a charge material, conductive powder and a binder applied to or deposited on a current collector, typically a planar sheet of copper or aluminum. The charge material includes anode charge material, usually graphite or carbon, and cathode charge material, which includes a predetermined ratio of metals such as lithium, nickel, manganese, cobalt, aluminum, iron and phosphorous, defining a so-called "battery chemistry" of the Li-ion cells. The preferred battery chemistry varies between vendors and applications, and recycling efforts of Li-ion batteries typically adhere to a prescribed molar ratio of the battery chemistry in recycled charge material products. A morphology of the recycled charge material refers to density and porosity of particles in the finished products, also designated as a crystallinity. Single crystal particles of a predetermined size are generally preferred, and provide a predictable performance when generated.

SUMMARY

A Li-ion cathode material is prepared using a multi-stage lithiation process that combines a total amount of lithium, as called for by the recycled battery, in a series of sintering stages. The cathode material includes charge material metals in a predetermined ratio, and a substantially equal quantity of lithium. A leaching-ratio adjustment-coprecipitation sequence forms a cathode active material precursor having the predetermined ratio from a comingled recycling stream of Li-ion batteries. The precursor is typically a hydroxide of the charge material metals and is sintered with a lithium salt such as lithium carbonate or lithium hydroxide in a sequence of stages for a predetermined duration and temperature, each stage having only a portion of the total lithium salt quantity. It has been found that the initial sintering stage at least in part defines the crystallinity of the resulting cathode material and has a particle size determined at least in part by the portion of lithium at each stage. In this way, the properties of the cathode material can be controlled and predicted.

Configurations herein are based, in part, on the observation that recycled cathode active material (CAM, active material, or cathode material) take a granular form having a range of particle sizes, which is formulated with binder and conductive particles onto a battery electrode for the recycled battery. Unfortunately, conventional approaches to battery recycling suffer from the shortcoming that particle sizes of the cathode material vary in size and crystallinity, resulting in variations in porosity and density. It would be beneficial to control particle size of the cathode material to attain consistency based on a preferred size from a customer or manufacturing specification. Accordingly, configurations herein substantially overcome the shortcomings of conventional approaches by performing the lithiation over multiple stages of sintering, and varying the temperature, time and proportion of lithium at each stage.

A particular configuration discussed below depicts a method of producing a cathode material from a recycled lithium-ion battery stream by sintering a combination of a lithium salt and a cathode material precursor comprising metallic elements of nickel, cobalt, and manganese in a ratio of Li:total metallic elements of 1 to 1.1. In the recycling process, the cathode material precursor can be formed by leaching a black mass from the lithium-ion battery recycling stream to obtain an acidic aqueous leach solution of metal salts comprising a nickel salt, a cobalt salt, and a manganese salt in a molar ratio of metallic elements, and coprecipitating. The molar ratio of the metallic elements can be adjusted to a selected or targeted ratio prior to coprecipitation. The cathode material precursor is then combined with a first portion of the lithium salt to form a first mixture having a Li:total metallic elements ratio that is less than or equal to 1, and heating the first mixture at a first sintering temperature of from 900-1200° C. for a first sintering time of from 2-10 hours to form a lithium-deficient sintered material. In other words, only a portion of the total amount of lithium intended for the final cathode material of the recycled battery has been include in the first sintering stage. A subsequent sintering stage combines the lithium-deficient sintered material with the remaining portion of the lithium salt to form a second mixture. The second mixture is then sintered (heated) at a second sintering temperature of from 800-1000° C. for a second sintering time of from 5-15 hours to form the cathode material. Generally, the first sintering temperature is greater than the second sintering temperature, and the first sintering time is less than the second sintering time, to facilitate predictable sizes, morphology, and crystallinity of the resulting active cathode material.

BRIEF DESCRIPTION OF THE DRAWINGS

The foregoing and other features will be apparent from the following description of particular embodiments disclosed herein, as illustrated in the accompanying drawings in which like reference characters refer to the same parts throughout the different views. The drawings are not necessarily to scale, emphasis instead being placed upon illustrating the principles of the invention.

FIGS. 3A-3D show scanning electron micrograph (SEM) images of the granular active cathode material generated from the multi-stage lithiation as described herein.

DETAILED DESCRIPTION

Depicted below is an example method and approach for recycling batteries, such as Li-ion batteries. Li-ion batteries employ a so-called battery chemistry, which defines the types and ratios of metal ions used to form the cathode material; anode material is almost always a carbon or graphite-based formulation. Configurations herein employ a nickel, manganese and cobalt, or NMC battery chemistry as an example. However, the disclosed approach may be practiced with any suitable battery chemistry. The particular ratio is set by the manufacturer or recipient of the recycled charge material, and charge material and charge material precursor can be generated meeting the manufacturer prescribed specifications.

Figure 1:
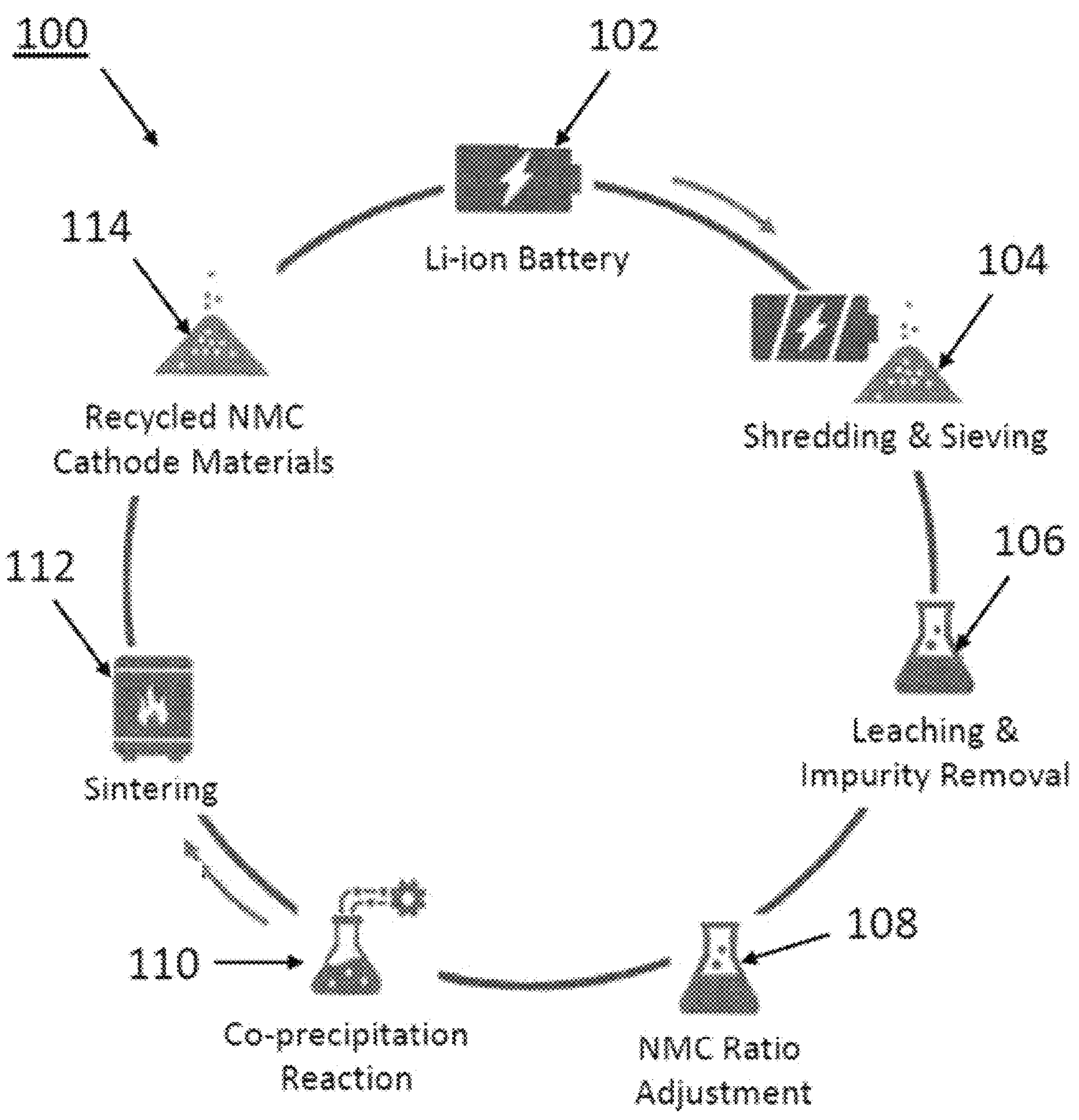
FIG. 1 is a context diagram of a recycling environment suitable for use with configurations herein.

FIG. 1 is a context diagram of a recycling environment suitable for use with configurations herein. Referring to FIG. 1, a recycling scenario 100 begins with a deployed Li-ion battery 102, typically from an EV. Li-ion batteries 102 have a finite number of charge cycles before the ability of the charge material to accept sufficient charge degrades substantially. Add to this the batteries from premature end-of-life due to vehicle failure, collision damage, etc. This collective end-of-life recycling stream contributes to an abundant supply of exhausted batteries comprising spent cells and charge material. The batteries are discharged and agitated into a granular black mass 104 through physical grinding, shredding and pulverizing. Agitation results in a black mass of granular charge material and any incidental casing and current collectors of copper and aluminum. The black mass, including both cathode material of cathode material metallic elements and anode materials of carbon and graphite, is used to form a leach solution 106 of dissolved charge material metal salts.

The leach solution includes Ni, Mn and Co salts, such as sulfate salts from sulfuric acid leaching, however other charge material metals and/or leach acid may be employed. The leach solution 106 has a molar ratio of Ni, Mn and Co based on the constituent composition of the incoming recycling stream. The molar ratio is adjusted with additional Ni, Mn and Co salts, such as sulfate (typically a virgin or control form of fresh materials) to yield a selected or target ratio-adjusted solution 108.

A coprecipitation reaction 110 begins by adjusting the pH of the leach solution for precipitating the charge material metals (the metallic elements and the additional metal salts) in the desired ratio resulting from the adjustment. Sodium hydroxide or other strong base can be used to cause the charge material to fall out of solution in a granular form, separable by filtration, typically as hydroxides. This granular form precipitated from the pH adjustment of the leach solution defines the pCAM (cathode active material precursor), having the desired molar ratio for a target battery chemistry for new, recycled batteries. Sintering in a furnace 112 with lithium carbonate or other lithium salts forms the cathode active material 114 (CAM) for the recycled Li-ion battery. In an example configuration, cathode active material defined by $LiNi_xMn_yCo_2O_2$ is synthesized by sintering $Ni_xMn_yCo_z(OH)_2$ and $Li_2CO_3$, where x, y and z represent the respective molar ratios of Ni, Mn and Co. Common chemistries include NMC 111, representing equal molar components of Ni, Mn and Co, NMC 811, NMC 622 and NMC 532, however any suitable molar ratio may be achieved by the ratio adjustment in the leach solution 106-108 and sintering. The recycled cathode material may then be merged back into the recycling stream as cathode material.

The resulting recycled Li-ion battery therefore includes active cathode material of metallic elements defined by the battery chemistry of the recycled battery stream, additional metal salts used to adjust the ratio to a selected ratio, and lithium, formed as described in copending U.S. patent application Ser. No. 17/412,742 and related parent cases, filed Aug. 26, 2021, entitled "CHARGE MATERIAL FOR RECYCLED LITHIUM-ION BATTERIES," incorporated herein by reference in entirety. The complete battery of course includes anode active material, usually graphite and/or carbon, all adhered to appropriate current collectors in a casing for electrical communication for usage and charging. In a typical configuration, a nickel, manganese and cobalt (NMC) battery has these metal elements in a ratio according to a prescribed battery chemistry, and is ideally mixed in at least equal molar ratios with Li to form the recycled battery.

Figure 2:
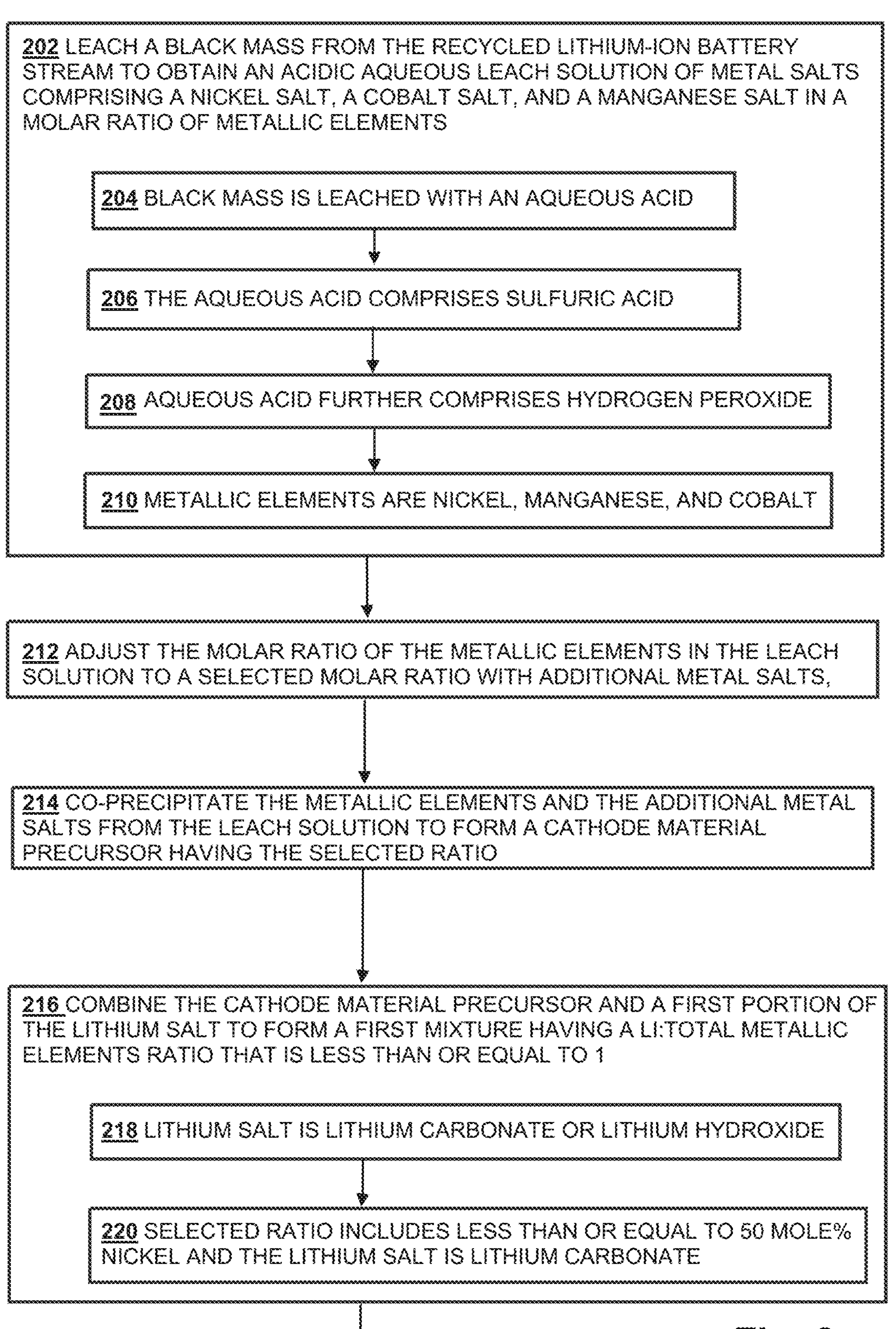
FIG. 2 is a flowchart of the multi-stage lithiation process for generating active cathode material.
Figure 2:
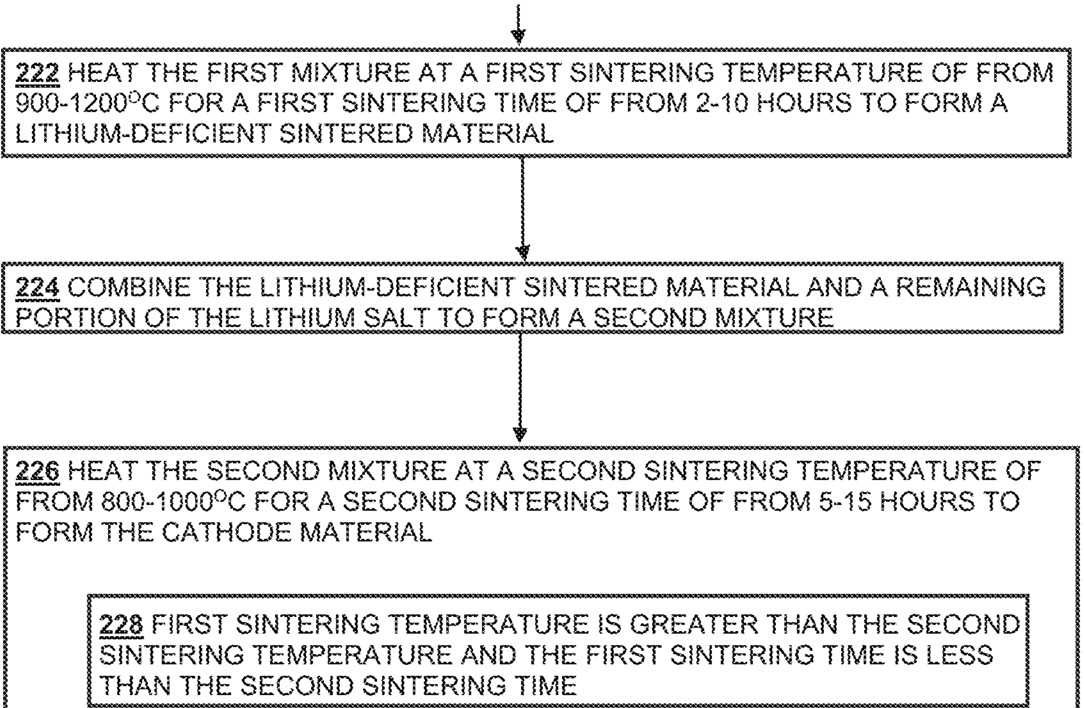

FIG. 2 is a flowchart 200 of the multi-stage lithiation process for generating active cathode material. In configurations herein, the method of producing a cathode material from a recycled lithium-ion battery stream includes sintering a combination of a lithium salt and a cathode material precursor comprising metallic elements selected from the group consisting of nickel, cobalt, and manganese in a Li:total metallic elements ratio of 1 to about 1.1. Some lithium tends to burn off or otherwise be lost, so the total lithium before sintering is slightly more (about 0-10% excess) to achieve a finished active material with approximately equal proportions of Li and metallic elements. A significant feature of the configurations herein is to add and sinter the total lithium quantity in stages, rather than sintering with all of the lithium at once.

Referring to FIGS. 1 and 2, at step 202, in a preferred configuration, a black mass from the recycled Li-ion battery stream is leached to obtain an acidic aqueous leach solution of metal salts including the metallic elements from the recycling stream. In the present approach, seeking an NMC battery, this leach solution includes at least a nickel salt, a cobalt salt, and a manganese salt, defining a molar ratio of metallic elements. Other metal salts and contaminants may also be comingled, and may be removed or discarded by any suitable methods during the recycling process to ensure purity in the resulting active cathode material. Cathode active material, active material and cathode charge material all refer to the lithiated material following sintering, while precursor, cathode precursor and cathode material precursor refer to the coprecipitated metallic elements prior to lithiation via sintering.

Black mass including both cathode and anode materials are leached with an aqueous acid, as depicted at step 204, for dissolving metal salts of the metallic elements in the recycling stream. A typical leach agent is sulfuric acid, as disclosed at step 206, however other suitable inorganic or organic acids may be used. An oxidizing agent or reducing agent, such as hydrogen peroxide, may also be mixed in the leach solution, as shown at step 208. A typical battery composition employs metallic elements including nickel, manganese, and cobalt, depicted at step 210, however various metallic elements, such as aluminum, magnesium, and iron, may also be employed. Often a high nickel content in the recycling stream is use, such as in NMC 622 and NMC 811.

The molar ratio of the metallic elements in the leach solution is adjusted to a selected molar ratio with additional metal salts, usually sulfate forms of Ni, Mn and Co to achieve a precise tuning of the battery chemistry, as disclosed at step 212. Once the ratio of the metallic elements is adjusted, the pH is increased to co-precipitate the metallic elements and the additional metal salts (ratio adjusting Ni, Mn, Co salts) from the leach solution to form a cathode material precursor having the selected ratio, as depicted at step 214.

The precursor is a hydroxide precipitate of the Ni, Mn and Co metallic elements and forms the active cathode material when sintered with lithium carbonate or other suitable lithium salts. In the multi-stage sintering as disclosed herein, this includes combining the cathode material precursor and a first portion of the lithium salt to form a first mixture having a Li:total metallic elements ratio that is less than or equal to 1, as depicted at step 216. Thus, only a portion of the total lithium called for in the cathode material is used in the first stage. The lithium salt may be any known in the art, including, for example lithium carbonate or lithium hydroxide, as shown at step 218, and can be chosen based on the molar ratio of metallic elements. For example, when the selected molar ratio may include less than or equal to 50 mole % nickel, the lithium salt is preferably lithium carbonate, as depicted at step 220; alternatively, a high nickel chemistry (ratio) may be utilized, such that, when the selected molar ratio includes greater than 60 mole % nickel, the lithium salt is preferably lithium hydroxide.

The multistage lithiation includes, at step 222, heating the first mixture at a first sintering temperature of from 900-1200° C. for a first sintering time of from 2-10 hours to form a lithium-deficient sintered material. The first sintering stage tends to be the most significant for determining a particle size. The majority of the total lithium to be added is used in the first stage. However the resulting sintered material is still somewhat lithium deficient as it does not have the full complement of lithium called for. A second sintering stage combines the lithium-deficient sintered material and the remaining portion of the lithium salt to form a second mixture, as depicted at step 224, and the second mixture is heated at a second sintering temperature of from 800-1000° C. for a second sintering time of from 5-15 hours to form the cathode material, as depicted at step 226. The lithium percentage, sintering temperature, and duration may all be varied among the plurality of stages. However typically the first sintering temperature is greater than the second sintering temperature, and the first sintering time is less than the second sintering time, as shown at step 228. The example configuration depicts two sintering stages, however additional stages may be employed to apportion the computed amount of lithium among the stages, usually slightly more lithium than a 1:1 ratio to allow for burn-off during sintering.

Sintering occurs in a furnace capable of generating the temperature called for over the predetermined duration and for containing a meaningful quantity of the combined precursor and lithium. This may include heating in furnace having an oxygen-containing atmosphere flow to enhance crystal formation. A simple atmospheric air flow contains sufficient oxygen, or of course a dedicated pure gaseous source may be employed. A typical flow rate would be from 0.2 to 16 Standard Cubic Feet per Minute (SCFM).

FIGS. 3A-3D show scanning electron micrograph (SEM) images of the granular active cathode material generated from the multistage lithiation as described herein resulting from a two-stage sintering. As described previously, the lithium composition in the active cathode material should be an equal molar ratio to the aggregate metallic elements. A slight excess is added to accommodate loss and burn off during sintering. Accordingly, FIG. 3A shows active cathode material resulting from an 8% lithium excess (108% of the moles of NMC), apportioned with 90% in the first stage and 18% in the second stage. FIG. 3B shows a greater magnification where the single crystal structure is apparent.

FIG. 3C also shows cathode material prepared from an 8% lithium excess but apportioned with 93% in the first stage and 15% in the second stage. FIG. 3D depicts a larger magnification of FIG. 3C showing crystallinity and grain boundaries.

As can be seen, the resulting cathode material generally has a crystal structure determined by the Li:total metallic elements ratio of the first mixture, the first sintering temperature, and the first sintering time, and preferably a single crystal structure. Therefore, the crystal structure tends to be determined by the crystal structure of the lithium-deficient sintered material in the first sintering stage. In other words, the lithium-deficient sintered material has a particle size determined by the Li:total metallic elements ratio of the first mixture, the first sintering temperature, and the first sintering time, and the second stage enhances the structure at the determined particle size. The particle size of the cathode material resulting from the first stage is usually from 10 to 50 microns, and a jet-milling treatment may occur following any of the sintering stages.

While the system and methods defined herein have been particularly shown and described with references to embodiments thereof, it will be understood by those skilled in the art that various changes in form and details may be made therein without departing from the scope of the invention encompassed by the appended claims.

What is claimed is:

1. A method of producing a cathode material from a recycled lithium-ion battery stream, comprising leaching a black mass from the recycled lithium-ion battery stream to obtain an acidic aqueous leach solution of metal salts comprising a nickel salt, a cobalt salt, and a manganese salt in a molar ratio of metallic elements;

adjusting the molar ratio of the metallic elements in the leach solution to a selected molar ratio with additional metal salts;

co-precipitating the metallic elements and the additional metal salts from the leach solution to form a cathode material precursor comprising metallic elements selected from the group consisting of nickel, cobalt, and manganese having the selected molar ratio; and sintering a combination of a lithium salt and the cathode material precursor in a Li:total metallic elements ratio of 1 to 1.1 by:

combining the cathode material precursor and a first portion of the lithium salt to form a first mixture having a Li:total metallic elements ratio that is less than or equal to 1, heating the first mixture at a first sintering temperature of from 900-1200° C. for a first sintering time of from 2-10 hours to form a lithium-deficient sintered material, combining the lithium-deficient sintered material and a remaining portion of the lithium salt to form a second mixture, and heating the second mixture at a second sintering temperature of from 800-1000° C. for a second sintering time of from 5-15 hours to form the cathode material, wherein the first sintering temperature is greater than the second sintering temperature and the first sintering time is less than the second sintering time, and wherein the cathode material has a single crystal structure determined by the Li:total metallic elements ratio of the first mixture, the first sintering temperature, and the first sintering time.

2. The method of claim 1, wherein the black mass is leached with an aqueous acid.

3. The method of claim 2, wherein the aqueous acid comprises sulfuric acid.

4. The method of claim 3, wherein the aqueous acid further comprises hydrogen peroxide.

5. The method of claim 1, wherein the lithium salt is lithium carbonate or lithium hydroxide.

6. The method of claim 1, wherein the selected molar ratio includes less than or equal to 50 mole % nickel and the lithium salt is lithium carbonate.

7. The method of claim 1, wherein the selected molar ratio includes greater than 60 mole % nickel and the lithium salt is lithium hydroxide.

8. The method of claim 1, wherein the first mixture and the second mixture are heated in a furnace having an oxygen-containing atmosphere flow.

9. The method of claim 8, wherein the oxygen-containing atmosphere is air.

10. The method of claim 8, wherein the oxygen-containing atmosphere flow is from 0.2 to 16 SCFM.

11. The method of claim 1, wherein the lithium-deficient sintered material has a particle size determined by the Li:total metallic elements ratio of the first mixture, the first sintering temperature, and the first sintering time.

12. The method of claim 11, wherein a particle size of the lithium-deficient cathode material is from 10 to 50 microns.

13. The method of claim 1, further comprising jet-milling the lithium-deficient cathode material prior to forming the second mixture.

14. The method of claim 1, further comprising jet-milling the cathode material.

* * * * *